United States Patent
Watanabe et al.

(10) Patent No.: US 8,441,160 B2
(45) Date of Patent: May 14, 2013

(54) INVERTER-INTEGRATED ELECTRIC COMPRESSOR

(75) Inventors: Takayuki Watanabe, Tokyo (JP); Hiroyuki Kamitani, Tokyo (JP); Takeshi Hirano, Tokyo (JP); Takayuki Takashige, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 13/500,775

(22) PCT Filed: Feb. 4, 2011

(86) PCT No.: PCT/JP2011/052365
§ 371 (c)(1),
(2), (4) Date: Jun. 20, 2012

(87) PCT Pub. No.: WO2011/099429
PCT Pub. Date: Aug. 18, 2011

(65) Prior Publication Data
US 2013/0049550 A1     Feb. 28, 2013

(30) Foreign Application Priority Data

Feb. 10, 2010 (JP) ................................ 2010-027732

(51) Int. Cl.
*H02K 11/00* (2006.01)
(52) U.S. Cl.
USPC ............................................. 310/71; 310/51
(58) Field of Classification Search ................... 310/71, 310/68 R
See application file for complete search history.

(56) References Cited

U.S. PATENT DOCUMENTS

| 7,723,878 | B2 * | 5/2010 | Yagai et al. ..................... 310/71 |
| 2006/0138883 | A1 * | 6/2006 | Yagai et al. ..................... 310/71 |

(Continued)

FOREIGN PATENT DOCUMENTS

| EP | 2192301 A1 | 6/2010 |
| EP | 2233741 A1 | 9/2010 |

(Continued)

OTHER PUBLICATIONS

International Search Report for PCT/JP2011/052365, dated Apr. 19, 2011.

(Continued)

*Primary Examiner* — Thanh Lam
(74) *Attorney, Agent, or Firm* — Westerman, Hattori, Daniels & Adrian, LLP

(57) ABSTRACT

Provided is an inverter-integrated electric compressor which is compact, has excellent ease of mounting, can ensure heat resistance reliability, and can reduce vibration and noise. In an inverter-integrated electric compressor where an inverter device having a noise removing filter circuit and an inverter circuit is incorporated in an inverter accommodating section provided on an outer periphery of a housing, the inverter accommodating section consists of an inverter box provided on the outer periphery of the housing and in which the inverter circuit is accommodated and installed, and a junction box integrally coupled to the inverter box and in which a constituent component of the noise removing filter circuit is accommodated and installed, the junction box is coupled to the inverter box with internal spaces opposing each other, and functions as a cover of the inverter box, and the noise removing filter circuit is electrically wire-connected to the inverter circuit.

11 Claims, 8 Drawing Sheets

U.S. PATENT DOCUMENTS

| | | | |
|---|---|---|---|
| 2007/0231165 A1 | 10/2007 | Koide et al. | |
| 2008/0048509 A1* | 2/2008 | Murakami et al. | 310/51 |
| 2011/0285226 A1* | 11/2011 | Fujita et al. | 310/71 |
| 2011/0291501 A1* | 12/2011 | Watanabe et al. | 310/71 |
| 2012/0104886 A1* | 5/2012 | Yamasaki et al. | 310/71 |
| 2012/0160596 A1* | 6/2012 | Yamasaki | 180/443 |

FOREIGN PATENT DOCUMENTS

| | | |
|---|---|---|
| JP | 2003-322082 A | 11/2003 |
| JP | 2004-190547 A | 7/2004 |
| JP | 2005-344689 A | 12/2005 |
| JP | 2006-316755 A | 11/2006 |
| JP | 2007-263061 A | 10/2007 |
| JP | 2007-295639 A | 11/2007 |
| JP | 2007-309125 A | 11/2007 |
| JP | 2008-193767 A | 8/2008 |
| JP | 2009-074469 A | 4/2009 |
| WO | 2009/075157 A1 | 6/2009 |

OTHER PUBLICATIONS

Written Opinion of PCT/JP2011/052365, dated Apr. 19, 2011.

* cited by examiner

INVERTER-INTEGRATED ELECTRIC COMPRESSOR

TECHNICAL FIELD

The present invention relates to an inverter-integrated electric compressor where an inverter device is integrally incorporated on the outer periphery of a housing that incorporates an electric motor and a compressor.

BACKGROUND ART

Inverter-integrated electric compressors are used as compressors for air conditioners mounted on electric cars or hybrid cars. In the inverter-integrated electric compressors, an inverter accommodating section (an inverter box) is provided on the outer periphery of a housing that incorporates an electric motor and a compressor, and an inverter device that converts a direct-current power supplied from a power supply into a three-phase alternating-current power and applies the three-phase alternating-current power to the electric motor is incorporated therein. A rotating speed is variably controlled based on a control signal transmitted from a vehicle-side control unit (ECU).

The inverter device includes an inverter circuit composed of a power board on which a plurality of semiconductor switching elements (for example, IGBT) or the like that convert a direct-current power into a three-phase alternating-current power and apply the three-phase alternating-current power to the electric motor are implemented and a control board on which a control communication circuit such as CPU that controls the three-phase alternating-current power applied to the electric motor based on a control signal from the ECU is implemented, and a noise removing filter circuit provided in a power line that supplies a direct-current power to the inverter circuit. The noise removing filter circuit is formed by wire-connecting a plurality of electric components such as a head capacitor (a smoothing condenser), a normal mode coil, and a common mode coil.

In the inverter-integrated electric compressor as described above, in general, the inverter circuit and the noise removing filter circuit constituting the inverter device are collectively accommodated and installed in the inverter accommodating section (the inverter box) provided on the outer periphery of the housing, and are electrically wire-connected to each other through a bus bar to be incorporated therein (for example, see Patent Literatures 1 and 2).

Meanwhile, Patent Literature 3 discloses such a configuration that an inverter accommodating section in which an inverter device is accommodated and installed is composed of a lower case integrally molded with a housing of an electric compressor and an upper case coupled to the lower case and partially made of metal, and a circuit board where an electric circuit of the inverter device is provided, and electric components such as a coil and a capacitor constituting a noise removing filter circuit connected to the electric circuit are collectively accommodated and installed on the upper case side.

CITATION LIST

Patent Literature

{PTL 1}
Japanese Unexamined Patent Application, Publication No. 2003-322082

{PTL 2}
Japanese Unexamined Patent Application, Publication No. 2008-193767

{PTL 3}
Japanese Unexamined Patent Application, Publication No. 2007-309125

SUMMARY OF INVENTION

Technical Problem

However, when the power board and the control board constituting the inverter circuit, and the plurality of electric components constituting the noise removing filter circuit are collectively accommodated and installed in one inverter accommodating section, handling of a power cable, installation of the boards, and arrangement of the plurality of relatively large electric components constituting the noise removing filter circuit need to be performed in one narrow space. Thus, the layout provides low assemblability, and a direction in which the power cable is extracted is also limited. There is also a more dead space. As a result, there are problems that the inverter accommodating section has a larger planar area, projecting portions are formed in a plurality of directions from the housing, and the ease of mounting to vehicles is deteriorated.

To solve the problems, there has been a proposal to increase the degree of freedom of the layout by separately arranging the plurality of electric components constituting the noise removing filter circuit in another accommodating section from the accommodating section in which the inverter circuit is accommodated. However, since a plurality of projecting portions are formed by the accommodating sections around the housing, there occur problems that the ease of mounting is deteriorated, the number of components is increased, and the electric wire-connection is complicated. While an upper surface of the inverter accommodating section is closed by a cover after the inverter device is accommodated and installed therein, the cover is generally composed of a thin plate material. Thus, there sometimes occurs a problem of vibration and noise.

Moreover, when the inverter device is collectively accommodated and installed on the upper case side, a decrease in cooling performance for a heat generating component such as a semiconductor switching element implemented on the circuit board is concerned. That is, the heat generating component such as a semiconductor switching element is cooled by a refrigerant flowing through the housing with the lower case as a heat sink. In a case in which the circuit board is incorporated on the upper case side, the heat generating component may not come into sufficiently close contact with the lower case due to dimensional tolerance or the like when the upper case is attached to the lower case via a seal material or the like. Thus, a desired cooling effect may not be obtained, and the heat resistance reliability of the inverter device may be impaired.

The present invention has been made in view of such circumstances, and it is an object of the present invention to provide an inverter-integrated electric compressor which is compact, has excellent ease of mounting, can ensure heat resistance reliability, and can also reduce vibration and noise.

Solution to Problem

To achieve the above object, an inverter-integrated electric compressor according to the present invention employs the following solutions.

That is, an inverter-integrated electric compressor according to one aspect of the present invention is an inverter-integrated electric compressor where an inverter accommodating section is provided on an outer periphery of a housing that incorporates an electric motor and a compressor, and an inverter device having a noise removing filter circuit and an inverter circuit is integrally incorporated in the inverter accommodating section, wherein the inverter accommodating section is composed of an inverter box provided on the outer periphery of the housing and in which the inverter circuit is accommodated and installed, and a junction box integrally coupled to the inverter box and in which a constituent component of the noise removing filter circuit is accommodated and installed, and the junction box is coupled to the inverter box with internal spaces opposing each other, and also functions as a cover of the inverter box, and the noise removing filter circuit and the inverter circuit are electrically wire-connected to each other.

With the one aspect of the present invention, by integrally coupling the junction box in which the constituent component of the noise removing filter circuit is accommodated and installed to the inverter box in which the inverter circuit is accommodated and installed, the inverter device can be integrally incorporated on the outer periphery of the housing via the inverter accommodating section. Therefore, as compared to a case in which all the constituent components of the inverter device including the constituent component of the noise removing filter circuit are accommodated and installed in one inverter box, the degree of freedom of the layout can be improved, and a dead space can be reduced. Thus, the planar area of the inverter accommodating section can be reduced, and the inverter-integrated electric compressor can be made compact. Since the constituent component of the noise removing filter circuit is accommodated and installed in the junction box, the projecting height of the inverter accommodating section from the outer periphery of the housing increases corresponding to the height dimensions of the constituent component. However, projecting portions are concentrated into one position, so that limitations in mounting to vehicles are rather reduced, and the ease of mounting can be improved. Moreover, since the inverter circuit is accommodated and installed in the inverter box provided on the outer periphery of the housing, a heat generating component such as a semiconductor switching element constituting the inverter circuit can be installed in close contact with the housing side. Therefore, a desired cooling effect can be obtained with the housing as a heat sink. The heat resistance reliability of the inverter device can be thereby ensured. Also, since the junction box also functions as the cover of the inverter box, the cover of the inverter box can be provided as a structural object with high rigidity, its vibration and noise can be suppressed, and an increase in the number of components can be also inhibited.

Moreover, an inverter-integrated electric compressor according to one aspect of the present invention is the above inverter-integrated electric compressor, wherein an electric component constituting the noise removing filter circuit is mounted on a resin board of the noise removing filter circuit having a wiring pattern and a land, and is accommodated and installed in the junction box via the resin board.

With the one aspect of the present invention, the electric component constituting the noise removing filter circuit is mounted on the resin board of the noise removing filter circuit having the wiring pattern and the land, and is accommodated and installed in the junction box via the resin board. Therefore, a plurality of electric components such as a head capacitor (a smoothing condenser) and coils (a common mode coil and a normal mode coil) constituting the noise removing filter circuit can be wire-connected to each other by inserting and soldering lead wires and terminals of the electric components mounted on the resin board having the wiring pattern and the land into a hole of the land. Accordingly, as compared to a case in which the lead wires and the terminals are welded to a bus bar, the assemblability can be significantly improved. It is also not necessary to ensure a welding space or the like. Thus, the components can be arranged with higher density, and the height dimensions of the junction box can be reduced. The inverter accommodating section can be thereby made compact, so that the inverter-integrated electric compressor can be reduced in size.

Moreover, an inverter-integrated electric compressor according to one aspect of the present invention is the above inverter-integrated electric compressor, wherein a terminal block to which a power cable is connected is integrally molded with the resin board.

With the one aspect of the present invention, the terminal block to which the power cable is connected is integrally molded with the resin board. Therefore, it is not necessary to separately attach the terminal block to which the power cable is connected into the junction box. It is only necessary to directly connect the power cable to the terminal block integrally molded on the resin board. Accordingly, a connecting operation of the power cable is facilitated, and the number of components can be decreased.

Moreover, an inverter-integrated electric compressor according to one aspect of the present invention is any one of the above inverter-integrated electric compressors, wherein a through hole or a cutout is provided in the resin board corresponding to the electric component mounted thereon so as to circulate an adhesive or a moisture-proof, vibration-proof, and insulating gel material fed into the inverter accommodating section.

With the one aspect of the present invention, the through hole or the cutout is provided in the resin board corresponding to the electric component mounted thereon so as to circulate the adhesive or the moisture-proof, vibration-proof, and insulating gel material fed into the inverter accommodating section. Therefore, even when the electric component constituting the noise removing filter circuit is mounted on the resin board, the adhesive such as a silicon adhesive or the moisture-proof, vibration-proof, and insulating gel material fed into the inverter accommodating section can be circulated between the electric component and the resin board through the through hole or the cutout. The adhesive can be thereby reliably permeated into a desired position. The gel material can be also effectively fed, so that moisture-proof, vibration-proof, and insulating effects for the electric component constituting the noise removing filter circuit can be reliably maintained.

Moreover, an inverter-integrated electric compressor according to one aspect of the present invention is any one of the above inverter-integrated electric compressors, wherein a wall portion that presses an outer periphery of a coil constituting the electric component mounted on the resin board is integrally molded with the resin board.

With the one aspect of the present invention, the wall portion that presses the outer periphery of the coil constituting the electric component mounted on the resin board is integrally molded with the resin board. Therefore, the wall portion integrally molded with the resin board to press the outer periphery of the coil performs positioning of the coil such as the normal mode coil and the common mode coil constituting the electric component, and thereby mounts the coil on the resin board. The electric component can be thereby accurately positioned via the resin board, and reliably insulated to be accommodated and installed in the junction box.

Moreover, an inverter-integrated electric compressor according to one aspect of the present invention is any one of the above inverter-integrated electric compressors, wherein the noise removing filter circuit accommodated and installed in the junction box and the inverter circuit accommodated and installed in the inverter box are electrically wire-connected to a PN input terminal on the inverter circuit side through a bus bar attached to the inverter circuit side.

With the one aspect of the present invention, the noise removing filter circuit accommodated and installed in the junction box and the inverter circuit accommodated and installed in the inverter box are electrically wire-connected to the PN input terminal on the inverter circuit side through the bus bar attached to the inverter circuit side. Therefore, the noise removing filter circuit on the junction box side and the PN input terminal of the inverter circuit on the inverter box side, which are separately provided from each other, can be electrically wire-connected to each other through the bus bar attached to the inverter circuit side. Accordingly, a power whose common mode noise and current ripple are reduced can be applied to the inverter circuit side by simply wire-connecting the noise removing filter circuit and the PN input terminal of the inverter circuit.

Moreover, an inverter-integrated electric compressor according to one aspect of the present invention is the above inverter-integrated electric compressor, wherein an end portion of the bus bar is inserted into a land for the bus bar provided in the resin board, and is soldered from outside through a through hole provided in the junction box.

With the one aspect of the present invention, the end portion of the bus bar is inserted into the land for the bus bar provided in the resin board, and is soldered from outside through the through hole provided in the junction box. Therefore, the noise removing filter circuit and the bus bar can be electrically wire-connected to each other by inserting the end portion of the bus bar attached to the inverter circuit side into a hole of the land for the bus bar of the resin board accommodated in the junction box, and soldering the end portion from outside through the through hole provided in the junction box. Accordingly, the noise removing filter circuit installed in the junction box that also functions as the cover of the inverter box can be easily soldered from outside and thereby wire-connected to the inverter circuit installed in the inverter box.

Moreover, an inverter-integrated electric compressor according to one aspect of the present invention is the above inverter-integrated electric compressor, wherein a lid member or a moisture permeable waterproof film that closes the through hole is provided in the through hole after the bus bar is soldered therethrough.

With the one aspect of the present invention, the lid member or the moisture permeable waterproof film that closes the through hole is provided in the through hole after the bus bar is soldered therethrough. Therefore, water can be prevented from entering the inverter accommodating section from outside by the lid member or the moisture permeable waterproof film, and waterproof and moisture-proof properties for the inverter device can be thereby ensured. Particularly, when the inverter accommodating section is filled with the vibration-proof and moisture-proof gel material, an inner pressure rises due to the thermal expansion of the gel material. When the moisture permeable waterproof film is used, moisture or the inner pressure rise by the thermal expansion generated in the inverter accommodating section can be released to outside through the moisture permeable waterproof film. Accordingly, seal disconnection or damage to the inverter device due to the pressure rise in the inverter accommodating section can be inhibited, and the reliability of the inverter-integrated electric compressor can be improved while maintaining the waterproof and moisture-proof properties for the inverter device.

Moreover, an inverter-integrated electric compressor according to one aspect of the present invention is any one of the above inverter-integrated electric compressors, wherein the bus bar, and a second bus bar that connect a UVW output terminal on the inverter circuit side and a glass seal terminal for applying a power from the inverter device to the electric motor are integrally insert-molded from a resin material to constitute a bus bar assembly.

With the one aspect of the present invention, the bus bar, and the second bus bar that connects the UVW output terminal on the inverter circuit side and the glass seal terminal for applying the power from the inverter device to the electric motor are integrally insert-molded from the resin material to constitute the bus bar assembly. Therefore, the noise removing filter circuit and the inverter circuit, and the inverter circuit and the glass seal terminal that applies the power to the electric motor can be electrically connected to each other through the bus bar assembly obtained by integrally insert-molding the bus bar and the second bus bar from the resin material. Accordingly, since the noise removing filter circuit, the inverter circuit, and the glass seal terminal can be wire-connected to each other through the one bus bar assembly, the assembling can be facilitated.

Moreover, an inverter-integrated electric compressor according to one aspect of the present invention is the above inverter-integrated electric compressor, wherein the inverter circuit includes an intelligent power module where the PN input terminal and the UVW output terminal are arrayed on one side, and the bus bar assembly and the glass seal terminal are arranged on the one side so as to oppose the PN input terminal and the UVW output terminal of the intelligent power module.

With the one aspect of the present invention, the inverter circuit includes the intelligent power module (IPM) where the PN input terminal and the UVW output terminal are arrayed on one side, and the bus bar assembly and the glass seal terminal are arranged on the one side so as to oppose the PN input terminal and the UVW output terminal of the intelligent power module. Therefore, the length of a wiring pathway from the noise removing filter circuit to the PN input terminal of the IPM constituting the inverter circuit through the bus bar assembly, and the length of a wiring pathway from the UVW output terminal of the IPM to the glass seal terminal through the bus bar assembly can be made as short as possible, and can be also simplified. Accordingly, circuit resistance therebetween can be minimized, and current detection accuracy can be improved. The influence of noise interference from disturbance can be also reduced, and the controllability and reliability of the inverter device can be improved.

Moreover, an inverter-integrated electric compressor according to one aspect of the present invention is any one of the above inverter-integrated electric compressors, wherein the noise removing filter circuit accommodated and installed in the junction box and the inverter circuit accommodated and installed in the inverter box are electrically connectable to each other via a pin provided on one of the circuit sides and a cluster block provided on the other circuit side and into which the pin is inserted and connected.

With the one aspect of the present invention, the noise removing filter circuit accommodated and installed in the junction box and the inverter circuit accommodated and installed in the inverter box are electrically connectable to each other via the pin provided on one of the circuit sides and the cluster block provided on the other circuit side and into which the pin is inserted and connected. Therefore, the noise removing filter circuit accommodated and installed on the junction box side and the PN input terminal of the inverter circuit accommodated and installed on the inverter box side can be simply electrically wire-connected to each other by inserting and connecting the pin provided on one of the circuit sides into the cluster block provided on the other circuit side. Particularly in a case of electric cars, a compressor is mounted in an environment with less vibration and a lower temperature than engine cars, and it is thus considered that the wire-connection using the pin and the cluster block is allowed. Accordingly, the wire-connection between the noise removing filter circuit on the junction box side and the inverter circuit on the inverter box side can be more simplified.

Advantageous Effects of Invention

According to the present invention, as compared to a case in which all the constituent components of the inverter device including the constituent component of the noise removing filter circuit are accommodated and installed in one inverter box, the degree of freedom of the layout can be improved, and a dead space can be reduced. Thus, the planar area of the inverter accommodating section can be reduced, and the inverter-integrated electric compressor can be made compact. Since the constituent component of the noise removing filter circuit is accommodated and installed in the junction box, the projecting height of the inverter accommodating section from the outer periphery of the housing increases corresponding to the height dimensions of the constituent component. However, projecting portions are concentrated into one position, so that limitations in mounting to vehicles are rather reduced, and the ease of mounting can be improved. Moreover, since the inverter circuit is accommodated and installed in the inverter box provided on the outer periphery of the housing, a heat generating component such as a semiconductor switching element constituting the inverter circuit can be installed in close contact with the housing side. As a result, a desired cooling effect can be obtained with the housing as a heat sink. The heat resistance reliability of the inverter device can be thereby ensured. Also, since the junction box also functions as the cover of the inverter box, the cover of the inverter box can be provided as a structural object with high rigidity, its vibration and noise can be suppressed, and an increase in the number of components can be also inhibited.

DESCRIPTION OF EMBODIMENTS

In the following, embodiments according to the present invention will be described by reference to the drawings.

First Embodiment

In the following, a first embodiment of the present invention will be described based on FIGS. 1 to 8.

Figure 1:
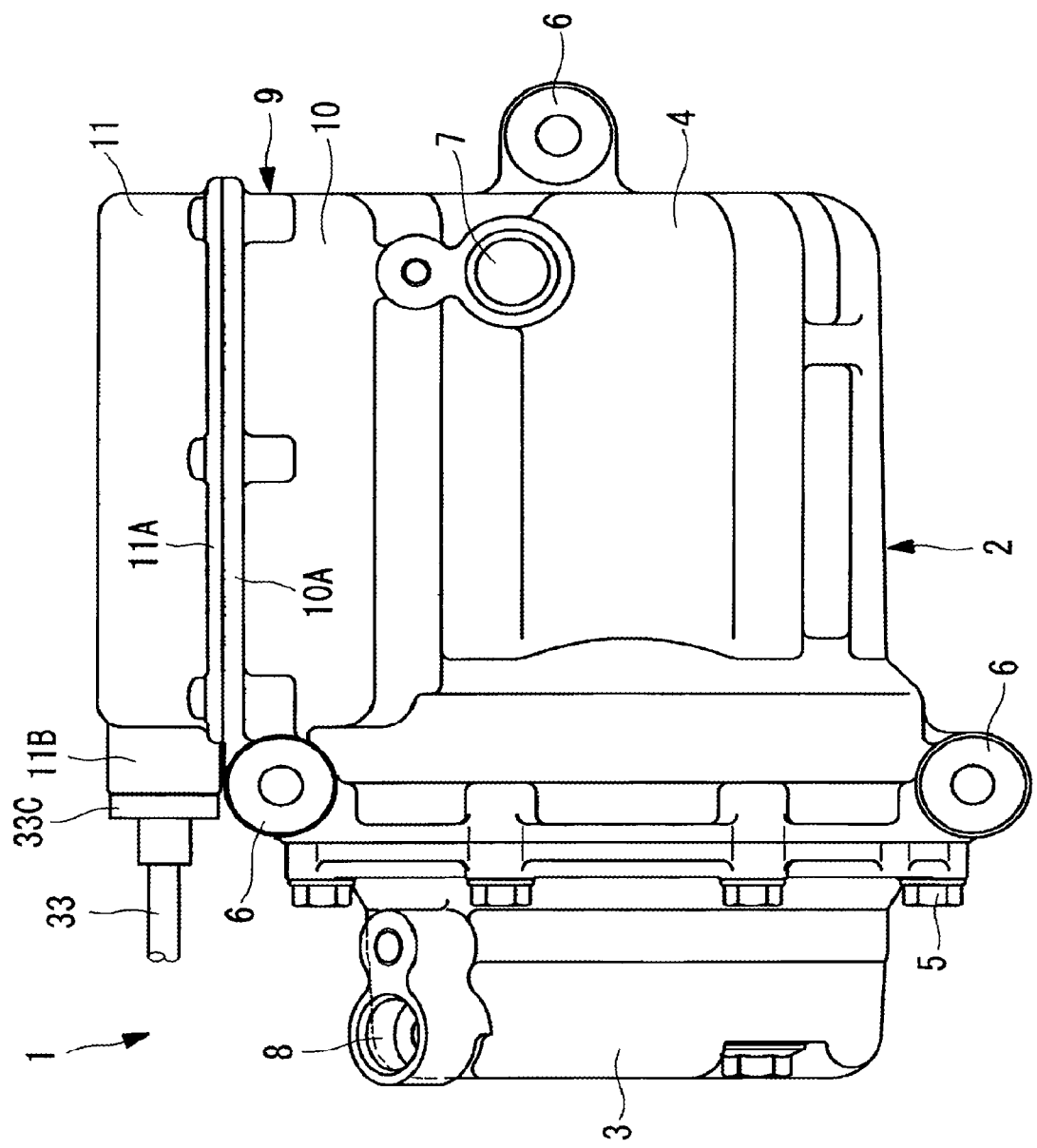
FIG. 1 is a side view of an inverter-integrated electric compressor according to a first embodiment of the present invention.
Figure 2:
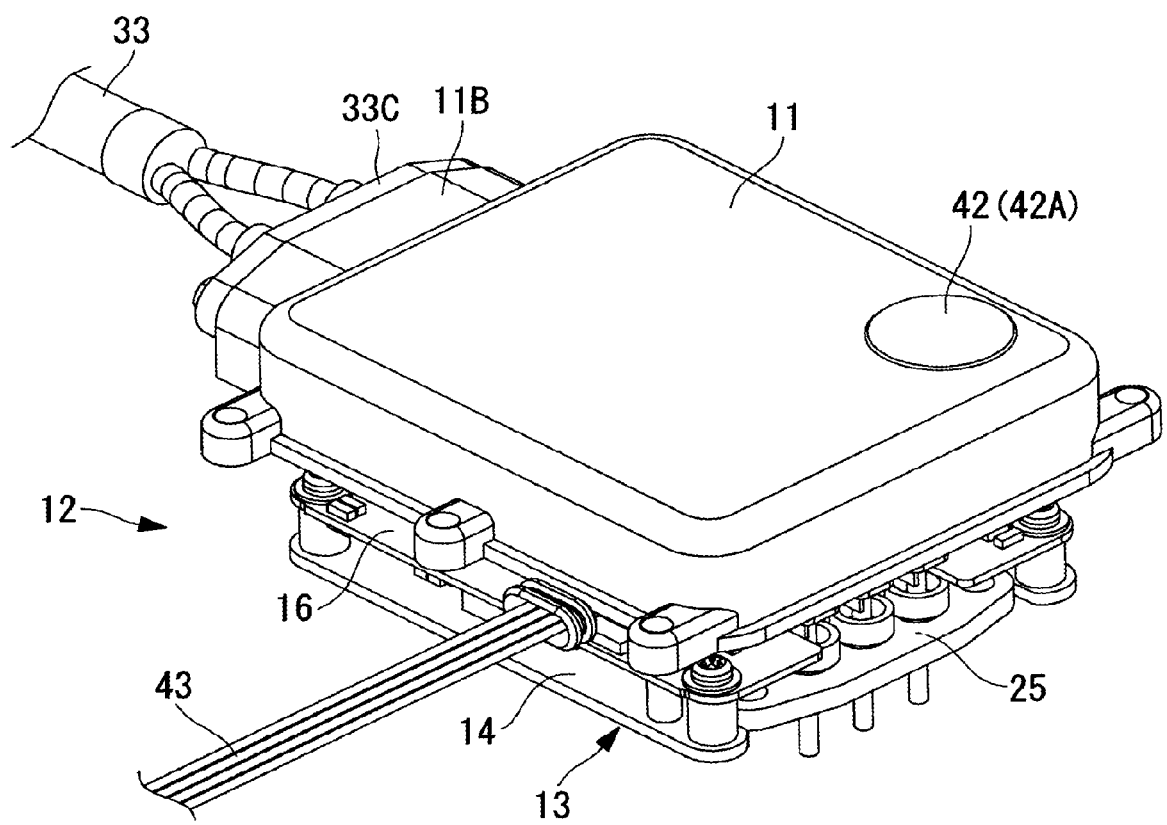
FIG. 2 is a perspective view of an inverter device incorporated in the inverter-integrated electric compressor shown in FIG. 1.
Figure 3:
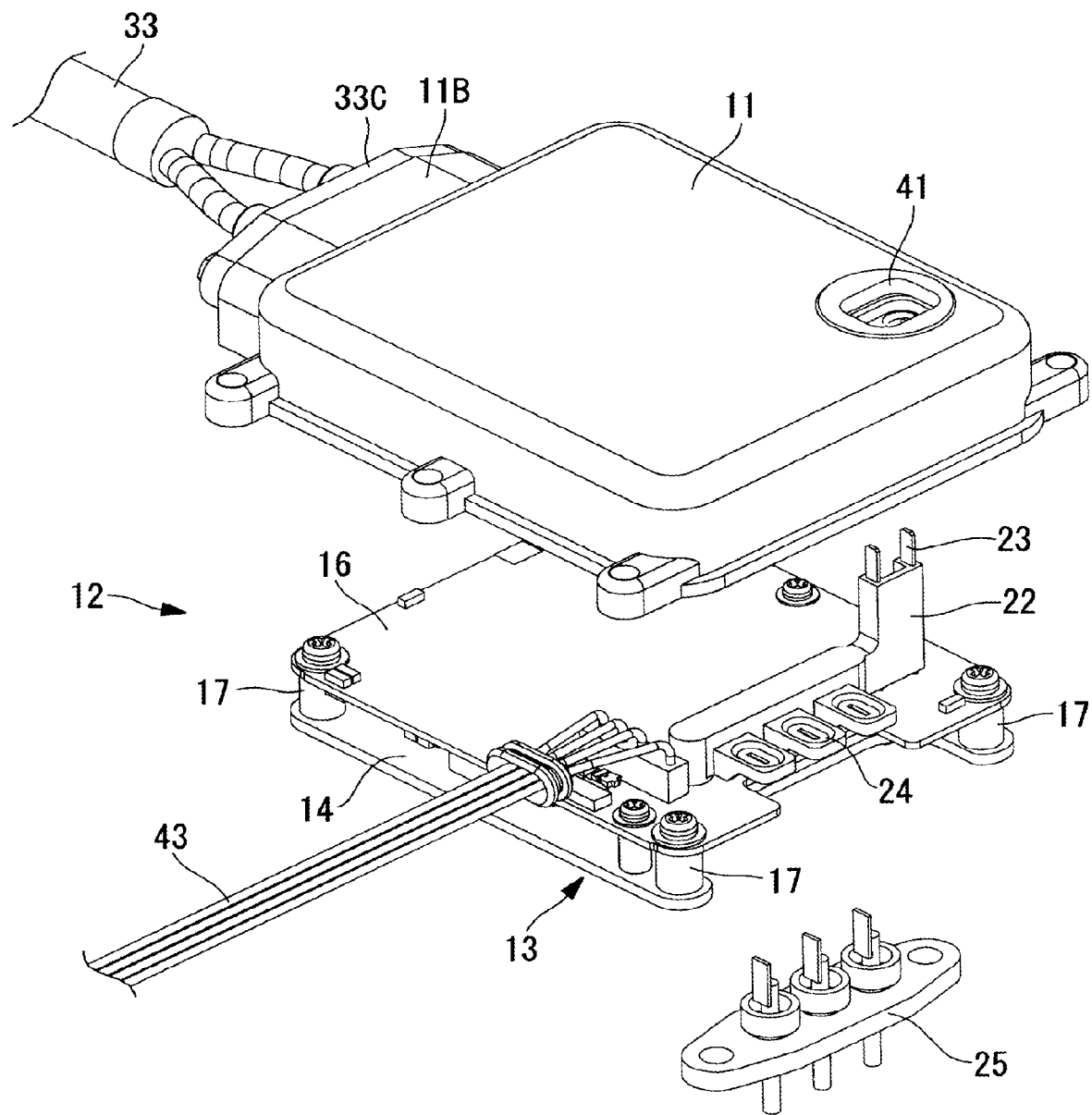
FIG. 3 is an exploded perspective view of the inverter device shown in FIG. 2.

FIG. 1 is a side view of an inverter-integrated electric compressor according to the first embodiment of the present invention. FIG. 2 is a perspective view of an inverter device incorporated therein. FIG. 3 is an exploded perspective view thereof.

An inverter-integrated electric compressor 1 includes a housing 2 that incorporates an electric motor and a compressor (not shown). The housing 2 is obtained by integrally coupling a compressor housing 3 that incorporates the compressor and a motor housing 4 that incorporates the electric motor with a bolt 5. The housings 3 and 4 are respectively made of aluminum die casting.

Leg portions 6 for installation of the compressor are integrally molded with an outer peripheral portion of the housing 2 at a plurality of positions (three positions in the present embodiment). A refrigerant suction port 7 that suctions a low-pressure refrigerant gas is provided on a rear end side (the right end side in FIG. 1) of the housing 2 (the motor housing 4). A refrigerant discharge port 8 that discharges a compressed refrigerant gas to outside is provided on a front end side (the left end side in FIG. 1) of the housing 2 (the compressor housing 3).

Moreover, an inverter accommodating section 9 in which an inverter device 12 is integrally incorporated is provided on the outer peripheral portion of the housing 2 (the outer peripheral portion on the motor housing 4 side). The inverter accommodating section 9 is composed of an inverter box 10 integrally molded with the housing 2 (the motor housing 4), and a junction box 11 integrally coupled to the inverter box 10 with a screw or the like. The junction box 11 also functions as a cover that closes an upper surface of the inverter box 10.

The inverter box 10 has an erected wall having a substantially rectangular shape in plan view and peripherally erected upward. The upper surface is formed as a flange surface 10A to which the junction box 11 is fixed, and a bottom surface on the inner side is formed as a flat surface on which an inverter circuit (an inverter module) 13 constituting the inverter device 12 is installed. The flat surface is composed of an outer peripheral wall of the motor housing 4.

The junction box 11 is a box body in which a noise removing filter circuit 26 constituting the inverter device 12 is accommodated and installed, and is made of aluminum die casting. The junction box 11 has the same rectangular shape in plan view as the inverter box 10. A flange surface 11A is formed on a lower surface of a peripheral wall so as to be integrally coupled to the inverter box 10. A flange surface 11B to which a connector 33C of a power cable 33 described below is connected is formed on one side surface (a front surface) of the junction box 11.

Figure 5:
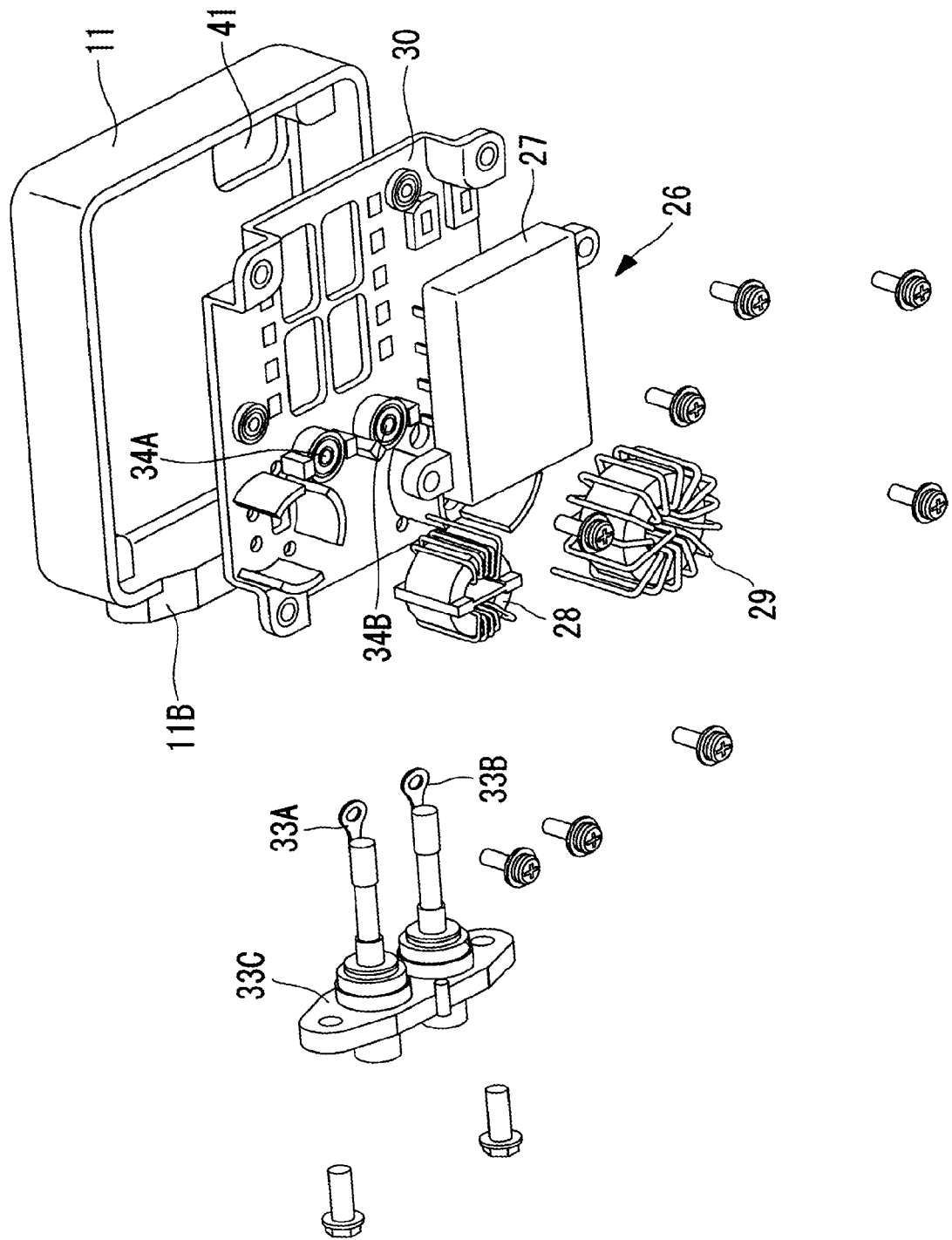
FIG. 5 is an exploded perspective view of the assembling of a junction box constituting the inverter device shown in FIG. 3.
Figure 6:
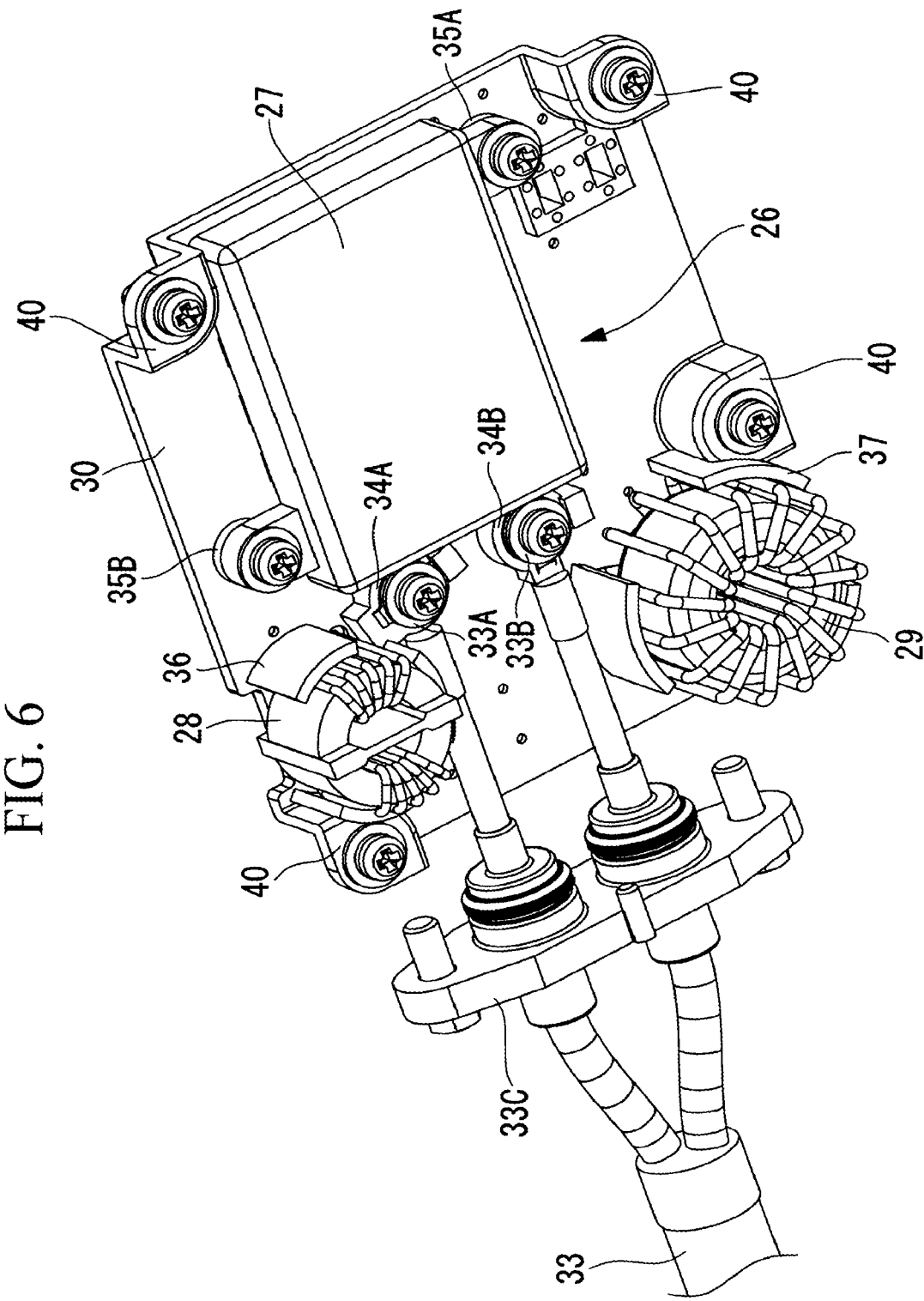
FIG. 6 is a perspective view illustrating a state in which constituent components of a noise removing filter circuit are attached to a resin board incorporated in the junction box shown in FIG. 5.

As shown in FIGS. 2 and 3, the inverter device 12 accommodated and installed in the inverter accommodating section 9 is composed of the inverter circuit (the inverter module) 13, and the noise removing filter circuit 26 accommodated and installed in the junction box 11 (see FIGS. 5 and 6). The inverter circuit (the inverter module) 13 is accommodated and installed in the inverter box 10, and the noise removing filter circuit 26 is accommodated and installed in the junction box 11.

Figure 4:
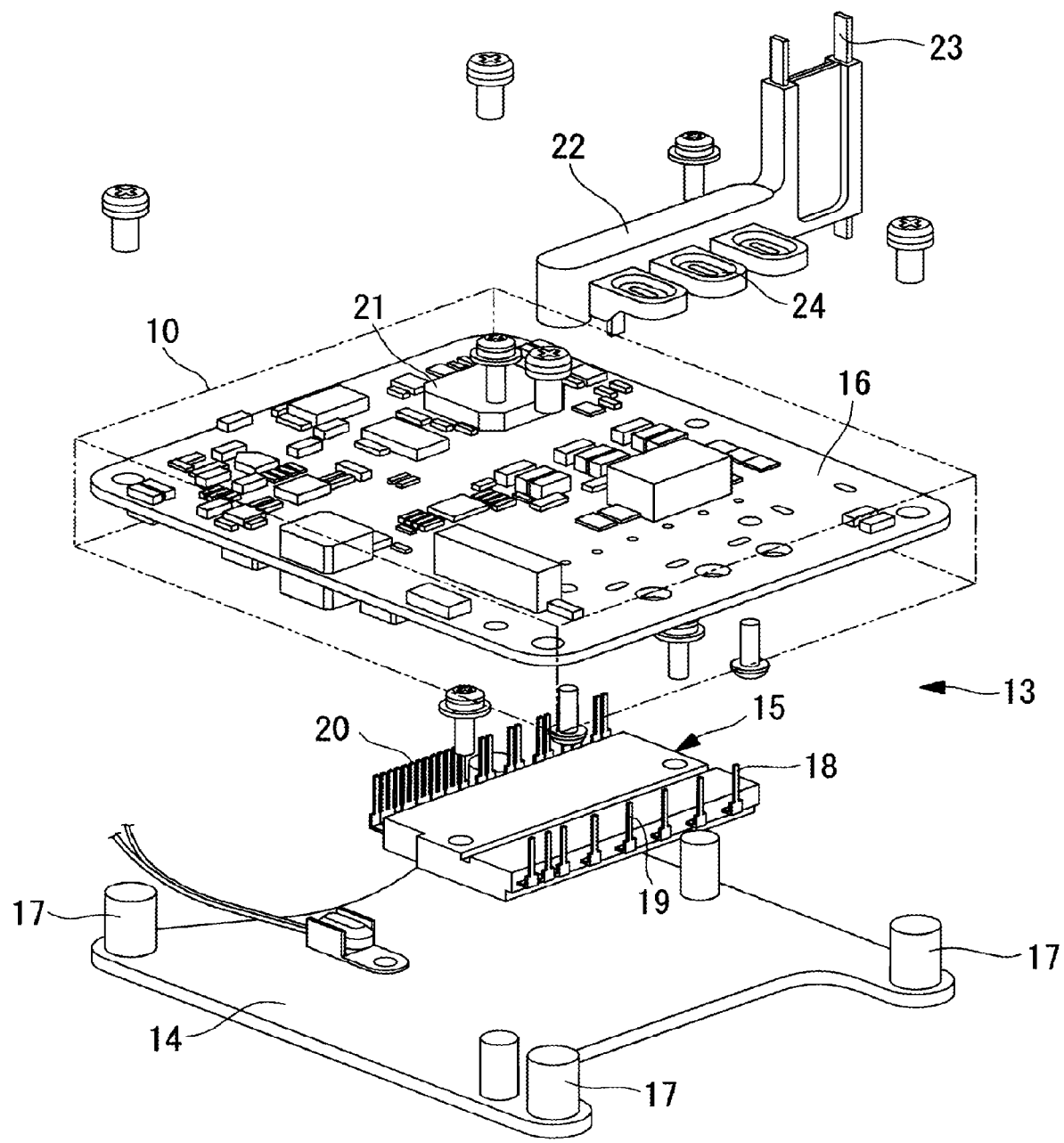
FIG. 4 is an exploded perspective view of an inverter module (an inverter circuit) constituting the inverter device shown in FIG. 3.

As shown in FIGS. 3 and 4, in the inverter circuit (the inverter module) 13, a metal base plate 14 for circuit implementation, an intelligent power module (referred to as IPM below) 15, and a control board 16 are integrated into one module via a plurality of spacers 17. The metal base plate 14 is composed of a rectangular plate material made of aluminum alloy. The metal base plate 14 is fixed with a screw to the bottom surface of the inverter box 10, i.e., the outer peripheral wall of the motor housing 4 formed as the flat surface so as to come into close contact therewith.

The IPM 15 is a power device for power control that constitutes the inverter circuit, and is a module where a driving circuit (a gate driver) and a self-protection function are integrally incorporated with a switching circuit composed of a plurality of semiconductor switching elements such as IGBT. The IPM 15 is screwed onto the metal base plate 14 so as to come into close contact therewith via an insulating material or the like. The IPM 15 is a rectangular module. A PN input terminal 18 that inputs a direct-current power applied through the noise removing filter circuit 26, and a UVW output terminal 19 that outputs a three-phase alternating-current power converted in the switching circuit toward the electric motor are collectively arrayed on the same line on one side in a longitudinal direction of the rectangular module. A plurality of microcomputer connection terminals 20 connected to a microcomputer 21 mounted on the control board 16 are collectively arrayed on the same line on the opposite side therefrom.

The control board 16 is a rectangular board connected to a vehicle-side control unit (ECU) through a communication wire 43 (see FIGS. 2 and 3), and on which a control circuit including the microcomputer 21 that transmits and receives a control signal to and from the ECU and controls the alternating-current power applied to the electric motor based on the control signal is implemented. The microcomputer 21 mounted on the control board 16 is arranged opposing the IPM 15 adjacent to the side where the microcomputer connection terminals 20 are arrayed. The control board 16 is integrated with the metal base plate 14 on which the IPM 15 is implemented via the plurality of spacers 17, to thereby constitute the two-stage inverter module 13.

The PN input terminal 18 of the IPM 15 penetrates a through hole of the control board 16, and is soldered to a pattern on the control board 16. Similarly, the UVW output terminal 19 penetrates a through hole of the control board 16, and is soldered to a pattern on the control board 16. Moreover, the microcomputer connection terminals 20 penetrate through holes of the control board 16, and are soldered to a pattern (not shown) to be connected to the microcomputer 21. A low-voltage wiring pathway connected to the ECU is thereby constituted.

A bus bar assembly 22 is incorporated on the control board 16. The bus bar assembly 22 is obtained by integrally insert-molding from a resin material a first bus bar 23 connected to the pattern on the control board 16 connected to the PN input terminal 18 of the IPM 15, and a second bus bar 24 connected to the pattern on the control board 16 connected to the UVW output terminal 19 of the IPM 15. The first bus bar 23 electrically wire-connects the PN input terminal 18 of the IPM 15 and the noise removing filter circuit 26. The second bus bar 24 electrically wire-connects the UVW output terminal 19 of the IPM 15 and a glass seal terminal 25 (see FIGS. 2 and 3).

The glass seal terminal 25 applies the three-phase alternating-current power converted in the inverter device 12 to the electric motor incorporated in the motor housing 4. The glass seal terminal 25 is arranged so as to penetrate the motor housing 4 in a rear end portion within the inverter box 10, and is connected to the electric motor via a harness (not shown) within the motor housing 4.

Meanwhile, as shown in FIGS. 5 to 8, the noise removing filter circuit 26 accommodated and installed in the junction box 11 is composed of a plurality of high-voltage electric components such as a head capacitor (a smoothing condenser) 27, a common mode coil 28, and a normal mode coil 29. The plurality of high-voltage electric components 27, 28, and 29 are mounted on a resin board 30 and thereby integrated into one module. For example, a plate-like thin film condenser where resin films are laminated, or a plate-like thin ceramic condenser is used for the head capacitor (the smoothing condenser) 27.

Figure 7:
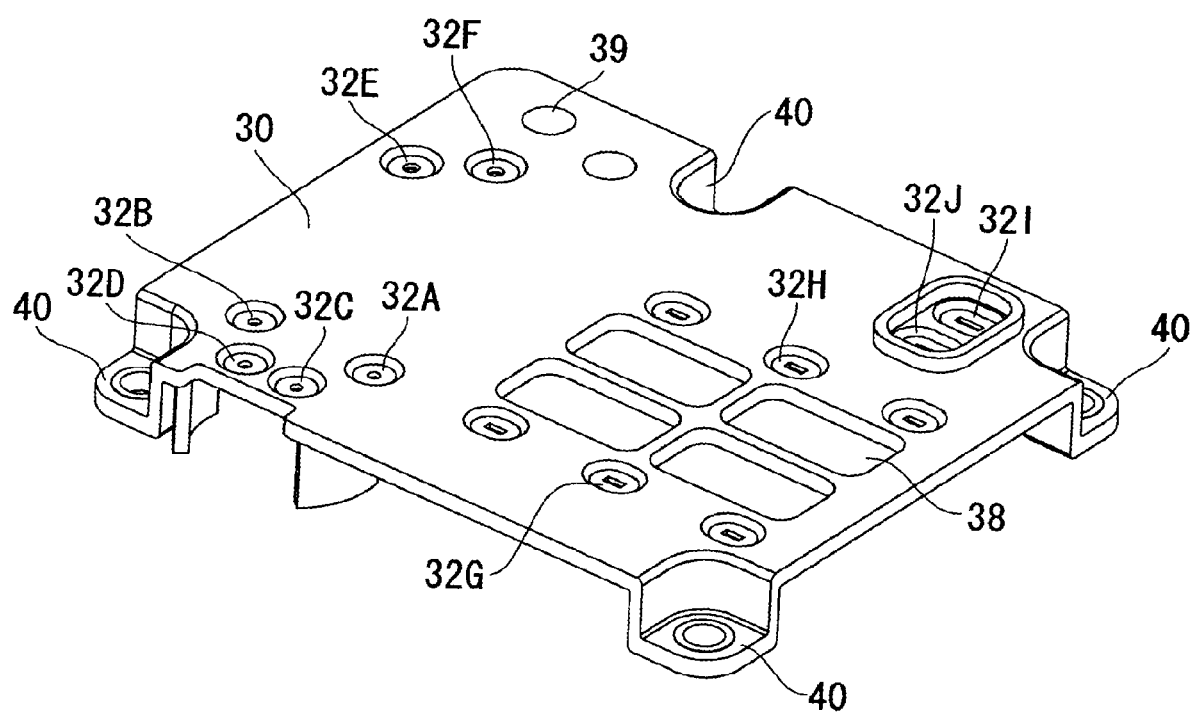
FIG. 7 is a perspective view of the resin board shown in FIG. 6.
Figure 8:
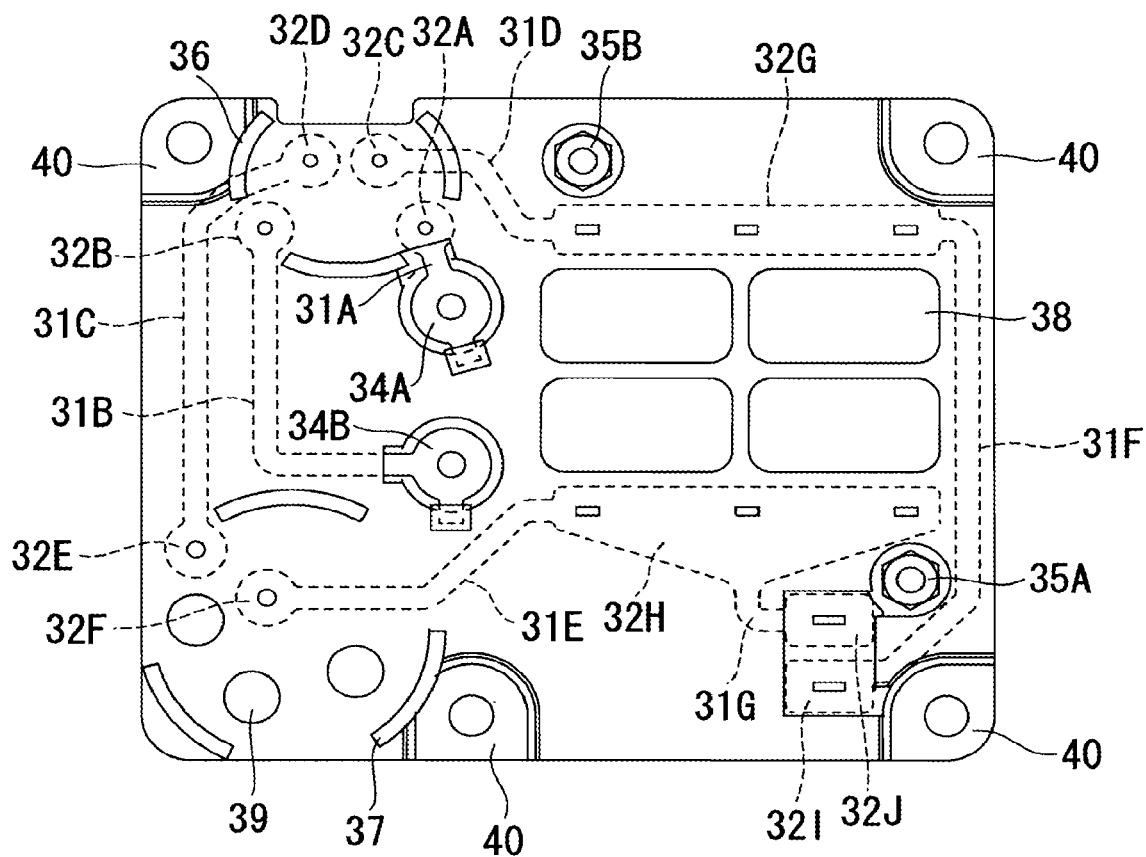
FIG. 8 is a plan view of the resin board shown in FIG. 7.

The noise removing filter circuit 26 stabilizes the driving of the inverter device 12 by reducing current ripple and common mode noise. As is well known, the noise removing filter circuit 26 has such a circuit configuration that the common mode coil 28, the normal mode coil 29, and the head capacitor (the smoothing condenser) 27 are sequentially wire-connected to a PN power line connected to a power supply. A wire-connection circuit among the common mode coil 28, the normal mode coil 29, and the head capacitor (the smoothing condenser) 27 is composed of a group of wiring patterns 31A to 31G and a group of lands 32A to 32J provided on the resin board 30 as shown in FIGS. 7 and 8.

That is, terminal blocks 34A and 34B to which terminals 33A and 33B of the power cable (an HV cable) 33 are connected are integrally molded with the resin board 30. The terminal blocks 34A and 34B, and the lands 32A and 32B to which input-side lead wires of the common mode coil 28 are connected are wire-connected to each other through the patterns 31A and 31B. The lands 32C and 32D to which output-side lead wires of the common mode coil 28 are connected, and the land 32E to which an input-side lead wire of the normal mode coil 29 is connected and the group of lands 32G to which one terminal group of the head capacitor (the smoothing condenser) 27 is connected are wire-connected to each other through the patterns 31C and 31D.

Similarly, the land 32F to which an output-side lead wire of the normal mode coil 29 is connected, and the group of lands 32H to which the other terminal group of the head capacitor (the smoothing condenser) 27 is connected are wire-connected to each other through the pattern 31E. Furthermore, the groups of lands 32G and 32H to which the terminal groups of the head capacitor (the smoothing condenser) 27 are connected, and the lands 32I and 32J to which the bus bar 23 connected to the PN input terminal 18 of the IPM 15 in the bus bar assembly 22 is connected are wire-connected to each other through the patterns 31F and 31G. The lead wires and the terminals of the respective electric components 27, 28, and 29 are connected by inserting end portions thereof into holes of the respective lands 32A to 32J and soldering the end portions thereto.

Two nuts 35A and 35B are insert-molded on the resin board 30 so as to screw and mount the head capacitor 27. Pressing wall portions 36 and 37 are each provided in a plurality of numbers on the resin board 30 so as to mount the common mode coil 28 and the normal mode coil 29 by pressing the outer periphery of the coil. Furthermore, an appropriate number of through holes 38 and 39 are respectively formed in the resin board 30 corresponding to the head capacitor 27 and the normal mode coil 29 mounted thereon. The through holes 38 and 39 are used as holes for circulating between the respective electric components 27 and 29 and the resin board 30 a silicon adhesive or a moisture-proof, vibration-proof, and insulating silicon gel material (not shown) fed into the inverter box 10 or the junction box 11.

In the embodiment shown in the drawings, a through hole for circulating the silicon adhesive or the silicon gel material is not provided corresponding to the common mode coil 28. However, it goes without saying that the same through hole may be also provided. Cutouts provided in an outer peripheral portion of the resin board 30 may be also employed instead of the through holes 38 and 39.

After the head capacitor 27, the common mode coil 28, the normal mode coil 29, and the like constituting the noise removing filter circuit 26 are mounted on the resin board 30, the resin board 30 is accommodated in the junction box 11 as shown in FIGS. 5 and 6. The resin board 30 is fixedly installed in the junction box 11 by screwing fixing portions 40 provided at the four peripheral corners. The power cable 33 is connected to the flange surface 11B of the junction box 11 via the connector 33C. The terminals 33A and 33B provided at an end portion thereof are screwed to the terminal blocks 34A and 34B insert-molded on the resin board 30.

A through hole (for soldering) 41 is further provided in one corner of the junction box 11. The through hole 41 is used when soldering is performed from outside on an end portion of the first bus bar 23 of the bus bar assembly 22 incorporated on the inverter module 13 side after the end portion is inserted into the holes of the lands 32I and 32J provided in the resin board 30 that is accommodated and installed in the junction box 11. By soldering the first bus bar 23 as described above, the noise removing filter circuit 26 on the junction box 11 side, and the PN input terminal 18 of the IPM 15 constituting the inverter module (the inverter circuit) 13 on the inverter box 10 side are electrically wire-connected to each other.

The through hole 41 (for soldering) is closed after the first bus bar 23 is soldered therethrough. To close the through hole 41, when the inverter accommodating section 9 is filled with the vibration-proof and moisture-proof gel material, a moisture permeable waterproof film 42 is used. The moisture permeable waterproof film 42 allows air or moisture to pass therethrough, but does not allow water to pass therethrough. Representative examples thereof include a porous fluorine resin film as a composite of PTFE (polytetrafluoroethylene) and polyurethane polymer called Gore-Tex (registered trademark) manufactured by W.L. Gore & Associates, Inc. in the United States, and a urethane-based shape-memory resin film called DiAPLEX (registered trademark).

When the inverter accommodating section 9 is not filled with the above gel material, a lid member 42A composed of a plate-like lid fixed by a snap ring or the like, or a screw-in plug may be used.

Because of the configuration described above, the present embodiment provides the following advantages.

The common mode noise, the current ripple or the like of a direct-current power supplied from the power supply mounted on a vehicle to the inverter device 12 incorporated in the inverter accommodating section 9 through the power cable 33 are reduced through the noise removing filter circuit 26 composed of the head capacitor 27, the common mode coil 28, and the normal mode coil 29 mounted on the resin board 30 from the terminal blocks 34A and 34B. After that, the direct-current power is input into the PN input terminal 18 on the inverter module (the inverter circuit) 13 side, that is, the PN input terminal 18 of the IPM 15 through the first bus bar 23 or the like.

The direct-current power is converted into a three-phase alternating-current power having a predetermined frequency in the IPM 15 based on a control signal input into the microcomputer 21 of the control board 16 from the ECU through the communication wire 43. After that, the three-phase alternating-current power is applied to the electric motor incorporated in the motor housing 4 from the UVW output terminal 19 of the IPM 15 through the second bus bar 24 and the glass seal terminal 25. Accordingly, the electric motor is driven, and the compressor coupled to a rotating shaft of the electric motor is driven. When the compressor is driven, a low-pressure refrigerant gas is suctioned into the housing 2 from the refrigerant suction port 7. The refrigerant gas is circulated around the motor in the motor housing 4 toward the compressor housing 3, and then suctioned into the compressor.

During this time, heat generating components such as the semiconductor switching elements (IGBT) of the IPM 15 constituting the inverter module 13 are cooled with the metal base plate 14 as a heat sink via the low-pressure refrigerant gas. The metal base plate 14 is composed of the aluminum alloy plate material in close contact with the outer peripheral wall of the motor housing 4. Thus, the heat generating components such as the semiconductor switching elements of the inverter device 12 can be effectively cooled down, and cooling performance can be ensured. A high-pressure refrigerant gas compressed in the compressor is discharged into the compressor housing 3, and delivered toward a refrigeration cycle through the refrigerant discharge port 8.

In the above inverter-integrated electric compressor 1, the inverter accommodating section 9 in which the inverter device 12 is accommodated and installed is composed of the inverter box 10 in which the inverter circuit (the inverter module) 13 is accommodated and installed, and the junction box 11 in which the constituent components 27, 28, and 29 of the noise removing filter circuit 26 are accommodated and installed. The inverter circuit (the inverter module) 13 and the constituent components 27, 28, and 29 of the noise removing filter circuit 26 constituting the inverter device 12 are separately accommodated and installed. The junction box 11 is coupled to the inverter box 10 by fitting the flange surfaces 11A and 10A to each other with the internal spaces opposing each other, and also functions as the cover of the inverter box 10.

Therefore, as compared to a case in which all the constituent components of the inverter device 12 including the inverter circuit 13 and the constituent components 27, 28, and 29 of the noise removing filter circuit 26 are accommodated and installed in one inverter box, the degree of freedom of the layout can be improved, and a dead space can be reduced. As a result, the planar area of the inverter accommodating section 9 can be reduced, and the inverter-integrated electric compressor 1 can be made compact. Since the plurality of electric components 27, 28, and 29 constituting the noise removing filter circuit 26 are accommodated and installed in the junction box 11, the projecting height of the inverter accommodating section 9 from the outer periphery of the housing increases corresponding to the height dimensions of the electric components. However, projecting portions of the housing 2 in width and front-back directions are concentrated into one position, so that limitations in mounting to vehicles are rather reduced, and the ease of mounting can be improved.

Moreover, since the inverter circuit 13 is accommodated and installed in the inverter box 10 provided on the outer periphery of the housing 2, the heat generating components such as the semiconductor switching elements (IGBT) of the IPM 15 constituting the inverter circuit 13 can be installed in close contact with the housing 2 side. Therefore, a desired cooling effect can be obtained with the housing 2 as a heat sink. The heat resistance reliability of the inverter device 12 can be thereby ensured. Also, since the junction box 11 also functions as the cover of the inverter box 10, the cover of the inverter box 10 can be provided as a structural object with high rigidity, its vibration and noise can be suppressed, and an increase in the number of components can be also inhibited.

In the present embodiment, the plurality of electric components 27, 28, and 29 constituting the above noise removing filter circuit 26 are mounted on the resin board 30 having the group of wiring patterns 31A to 31G and the group of lands 32A to 32J constituting the wire-connection circuit, and are accommodated and installed in the junction box 11 via the resin board 30. Therefore, the plurality of electric components such as the head capacitor (the smoothing condenser) 27, the common mode coil 28, and the normal mode coil 29 constituting the noise removing filter circuit 26 can be wire-connected to each other by mounting the plurality of electric components 27, 28, and 29 on the resin board 30 having the group of wiring patterns 31A to 31G and the group of lands 32A to 32J, and inserting and soldering the lead wires and the terminals into the holes of the group of lands 32A to 32H.

Accordingly, as compared to a case in which the lead wires and the terminals of the plurality of electric components are welded to a bus bar, the assemblability can be significantly improved. It is also not necessary to ensure a welding space or the like. Thus, the components can be arranged with higher density, and the height dimensions of the junction box 11 can be reduced. The inverter accommodating section 9 can be thereby made compact, so that the inverter-integrated electric compressor 1 can be reduced in size. A cooling effect for the high-voltage electric components constituting the noise removing filter circuit accommodated and installed in the junction box 11 can be also expected to be obtained from a heat dissipation effect from the surface of the junction box 11.

Moreover, the terminal blocks 34A and 34B to which the power cable 33 is connected are integrally insert-molded with the resin board 30. Therefore, it is not necessary to separately attach the terminal blocks 34A and 34B to which the power cable 33 is connected. It is only necessary to directly connect the terminals 33A and 33B of the power cable 33 to the terminal blocks 34A and 34B integrally molded on the resin board 30. Accordingly, a connecting operation of the power cable 33 is facilitated, and the number of components can be decreased.

In addition, the through holes 38 and 39 or the cutouts are provided in an appropriate number in the resin board 30 corresponding to the plurality of electric components 27 and 29 mounted thereon so as to circulate the silicon adhesive or the moisture-proof, vibration-proof, and insulating silicon gel material fed into the inverter accommodating section 9. Therefore, even when the electric components 27 and 29 constituting the noise removing filter circuit 26 are mounted on the resin board 30, the adhesive or the gel material fed into the inverter accommodating section 9 can be circulated between the electric components 27 and 29 and the resin board 30 through the through holes 38 and 39 or the cutouts. The adhesive can be thereby reliably permeated into a desired position. The gel material can be also effectively fed, so that moisture-proof, vibration-proof, and insulating effects for the electric components 27 and 29 constituting the noise removing filter circuit 26 can be maintained.

The pressing wall portions 36 and 37 that press the outer peripheries of the common mode coil 28 and the normal mode coil 29 mounted on the resin board 30 are integrally molded with the resin board 30. The common mode coil 28 and the normal mode coil 29 are mounted on the resin board 30 via the pressing wall portions 36 and 37. Therefore, the pressing wall portions 36 and 37 perform positioning of the coils such as the normal mode coil 29 and the common mode coil 28, and thereby mount the coils on the resin board 30. The coils 28 and 29 can be thereby accurately positioned, and reliably insulated to be accommodated and installed in the junction box 11.

Furthermore, the noise removing filter circuit 26 accommodated and installed in the junction box 11 and the inverter circuit (the inverter module) 13 accommodated and installed in the inverter box 10 are electrically wire-connected to the PN input terminal 18 on the inverter circuit 13 side through the bus bar assembly 22 provided on the inverter circuit 13 side. Therefore, the noise removing filter circuit 26 on the junction box 11 side and the PN input terminal 18 of the inverter circuit 13 on the inverter box 10 side, which are separately provided from each other, can be electrically wire-connected to each other through the bus bar assembly 22 provided on the inverter circuit 13 side. Accordingly, the power whose common mode noise and current ripple are reduced can be applied to the inverter circuit 13 side by simply wire-connecting the noise removing filter circuit 26 and the PN input terminal 18 of the inverter circuit 13.

The end portion of the first bus bar 23 that wire-connects the noise removing filter circuit 26 and the PN input terminal 18 of the inverter circuit 13 is inserted into the holes of the lands 32I and 32J for the bus bar provided in the resin board 30, and is soldered from outside through the through hole 41 provided in the junction box 11. Therefore, the noise removing filter circuit 26 and the first bus bar 23 can be wire-connected to each other by inserting the end portion of the first bus bar 23 provided on the inverter circuit 13 side into the holes of the lands 32I and 32J of the resin board 30 accommodated in the junction box 11, and soldering the end portion from outside through the through hole 41 provided in the junction box 11. Accordingly, the noise removing filter circuit 26 installed in the junction box 11 that also functions as the cover of the inverter box 10 can be easily soldered from outside and thereby wire-connected to the inverter circuit 13 installed in the inverter box 10.

The through hole 41 is closed by the moisture permeable waterproof film 42 or the lid member after the first bus bar 23 is soldered therethrough. Therefore, water can be prevented from entering the inverter accommodating section 9 from outside by the moisture permeable waterproof film 42 or the lid member, and waterproof and moisture-proof properties for the inverter device can be thereby ensured. Particularly, when the inverter accommodating section 9 is filled with the vibration-proof and moisture-proof gel material, an inner pressure rises due to the thermal expansion of the gel material or the like. When the moisture permeable waterproof film 42 is used, moisture or the pressure rise by the thermal expansion generated in the inverter accommodating section 9 can be released to outside through the moisture permeable waterproof film 42. Accordingly, seal disconnection or damage to the inverter device 12 due to the pressure rise in the inverter accommodating section 9 can be inhibited, and the reliability of the inverter-integrated electric compressor 1 can be improved while maintaining the waterproof and moisture-proof properties for the inverter device 12.

The first bus bar 23, and the second bus bar 24 that connects the UVW output terminal 19 on the inverter circuit 13 side and the glass seal terminal 25 for applying the power from the inverter device 12 to the electric motor are integrally insert-molded from the resin material to constitute the bus bar assembly 22. Therefore, the noise removing filter circuit 26 and the inverter circuit 13, and the inverter circuit 13 and the glass seal terminal 25 that applies the power to the electric motor can be electrically wire-connected to each other through the bus bar assembly 22 obtained by integrally insert-molding the first bus bar 23 and the second bus bar 24 from the resin material. Accordingly, since the noise removing filter circuit 26, the inverter circuit 13, and the glass seal terminal 25 can be wire-connected to each other through the one bus bar assembly 22, the assembling can be facilitated.

Furthermore, the inverter circuit 13 according to the present embodiment includes the intelligent power module (IPM) 15 where the PN input terminal 18 and the UVW output terminal 19 are arrayed on one side, and the bus bar assembly 22 and the glass seal terminal 25 that applies the power to the electric motor are arranged on the one side so as to oppose the PN input terminal 18 and the UVW output terminal 19 of the IPM 15. With the configuration, the length of a wiring pathway from the noise removing filter circuit 26 to the PN input terminal 18 of the IPM 15 constituting the inverter circuit 13 through the bus bar assembly 22, and the length of a wiring pathway from the UVW output terminal 19 of the IPM 15 to the glass seal terminal 25 through the bus bar assembly 22 can be made as short as possible, and can be also simplified.

Accordingly, circuit resistance therebetween can be minimized, and current detection accuracy can be improved. The influence of noise interference from disturbance can be also reduced, and the controllability and reliability of the inverter device 12 can be improved. Similarly, in the IPM 15, the connection terminals 20 with the microcomputer 21 mounted on the control board 16 are arrayed on the opposite side from the PN input terminal 18 and the UVW output terminal 19, and the microcomputer 21 mounted on the control board 16 is arranged opposing the microcomputer connection terminals 20 adjacent thereto. Thus, the length of a wiring pathway between the IPM 15 and the microcomputer 21 on the control board 16 can be made as short as possible, and the low-voltage wiring pathway and the high-voltage wiring pathway on the control board 16 side can be separated to the right and left sides with the IPM 15 therebetween. Accordingly, mutual noise interference is suppressed, and malfunction or the like of the inverter device 12 can be prevented.

Second Embodiment

Next, a second embodiment of the present invention will be described.

The present embodiment differs from the aforementioned first embodiment in a wire-connection structure between the noise removing filter circuit 26 and the inverter circuit 13. Since the other components are the same as those of the first embodiment, the description thereof is omitted.

In the present embodiment, the noise removing filter circuit 26 and the inverter circuit 13 are electrically connectable to each other via a pin provided on one of the circuit sides 13 or 26, and a cluster block provided on the other circuit side 26 or 13 and into which the pin is inserted and connected instead of the first bus bar 23 described above.

As described above, the noise removing filter circuit 26 accommodated and installed in the junction box 11 and the inverter circuit 13 accommodated and installed in the inverter box 10 are electrically connectable to each other via the pin provided on one of the circuit sides and the cluster block provided on the other circuit side and into which the pin is inserted and connected. Therefore, the noise removing filter circuit 26 on the junction box 11 side and the PN input terminal 18 on the inverter circuit 13 side on the inverter box 10 side can be simply wire-connected to each other by inserting and connecting the pin provided on one of the circuit sides into the cluster block provided on the other circuit side.

Particularly in a case of electric cars, a compressor is mounted in an environment with less vibration and a lower temperature than engine cars, and it is thus considered that the wire-connection using the pin and the cluster block is allowed. Accordingly, the electric wire-connection between the noise removing filter circuit 26 on the junction box 11 side and the inverter circuit 13 on the inverter box 10 side can be more simplified. The wire-connection system by the pin and the cluster block may be also applied to the wire-connection between the UVW terminal 19 of the IPM 15 and the second bus bar 24.

The present invention is not limited to the aforementioned embodiments, and may be appropriately modified without departing from the scope of the invention. For example, in the above embodiments, the compressor of the inverter-integrated electric compressor 1 may be a compressor of any type. Although the example in which the inverter box 10 is integrally molded with the housing (the motor housing 4) 2 is described, the inverter box 10 may be provided separately from the housing 2, and may be attached to the housing 2.

Moreover, although the example in which the power cable 33 is extracted in a frontward direction (a left direction in FIG. 1) of the housing 2 is described in the above embodiments, the present invention is not limited thereto. The power cable 33 may be extracted in any direction such as a right-left direction and a backward direction.

REFERENCE SIGNS LIST 1 inverter-integrated electric compressor
2 housing
3 compressor housing
4 motor housing
9 inverter accommodating section
10 inverter box
11 junction box
12 inverter device
13 inverter circuit (inverter module)
15 intelligent power module (IPM)
18 PN input terminal
19 UVW output terminal
22 bus bar assembly
23 first bus bar
24 second bus bar
25 glass seal terminal
26 noise removing filter circuit
27 head capacitor (electric component)
28 common mode coil (electric component)
29 normal mode coil (electric component)
30 resin board
31A to 31G group of wiring patterns
32A to 32J group of lands
33 power cable
34A, 34B terminal block
36, 37 pressing wall portion
38, 39 through hole
41 through hole (for soldering)
42 moisture permeable waterproof film
42A lid member

The invention claimed is:

1. An inverter-integrated electric compressor where an inverter accommodating section is provided on an outer periphery of a housing that incorporates an electric motor and a compressor, and an inverter device having a noise removing filter circuit and an inverter circuit is integrally incorporated in the inverter accommodating section,
wherein the inverter accommodating section is composed of an inverter box provided on the outer periphery of the housing and in which the inverter circuit is accommodated and installed, and a junction box integrally coupled to the inverter box and in which a constituent component of the noise removing filter circuit is accommodated and installed,
the junction box is coupled to the inverter box with internal spaces opposing each other, and
also functions as a cover of the inverter box, and
the noise removing filter circuit and the inverter circuit are electrically wire-connected to each other.

2. The inverter-integrated electric compressor according to claim 1, wherein an electric component constituting the noise removing filter circuit is mounted on a resin board of the noise removing filter circuit having a wiring pattern and a land, and is accommodated and installed in the junction box via the resin board.

3. The inverter-integrated electric compressor according to claim 2, wherein a terminal block to which a power cable is connected is integrally molded with the resin board.

4. The inverter-integrated electric compressor according to claim 2, wherein a through hole or a cutout is provided in the resin board corresponding to the electric component mounted thereon so as to circulate an adhesive or a moisture-proof, vibration-proof, and insulating gel material fed into the inverter accommodating section.

5. The inverter-integrated electric compressor according to claim 2, wherein a wall portion that presses an outer periphery of a coil constituting the electric component mounted on the resin board is integrally molded with the resin board.

6. The inverter-integrated electric compressor according to claim 1, wherein the noise removing filter circuit accommodated and installed in the junction box and the inverter circuit accommodated and installed in the inverter box are electrically wire-connected to a PN input terminal on the inverter circuit side through a bus bar attached to the inverter circuit side.

7. The inverter-integrated electric compressor according to claim 6, wherein an end portion of the bus bar is inserted into a land for the bus bar provided in the resin board, and is soldered from outside through a through hole provided in the junction box.

8. The inverter-integrated electric compressor according to claim 7, wherein a lid member or a moisture permeable waterproof film that closes the through hole is provided in the through hole after the bus bar is soldered therethrough.

9. The inverter-integrated electric compressor according to claim 6, wherein the bus bar, and a second bus bar that connect a UVW output terminal on the inverter circuit side and a glass seal terminal for applying a power from the inverter device to the electric motor are integrally insert-molded from a resin material to constitute a bus bar assembly.

10. The inverter-integrated electric compressor according to claim 9, wherein the inverter circuit includes an intelligent power module where the PN input terminal and the UVW output terminal are arrayed on one side, and the bus bar assembly and the glass seal terminal are arranged on the one side so as to oppose the PN input terminal and the UVW output terminal of the intelligent power module.

11. The inverter-integrated electric compressor according to claim 5, wherein the noise removing filter circuit accommodated and installed in the junction box and the inverter circuit accommodated and installed in the inverter box are electrically connectable to each other via a pin provided on one of the circuit sides and a cluster block provided on the other circuit side and into which the pin is inserted and connected.

* * * * *